United States Patent
Yata et al.

(10) Patent No.: US 6,710,676 B2
(45) Date of Patent: Mar. 23, 2004

(54) SURFACE ACOUSTIC WAVE FILTER DEVICE

(75) Inventors: Masaru Yata, Ishikawa-ken (JP); Kazunobu Shimoe, Kanazawa (JP); Yoichi Sawada, Ishikawa-ken (JP); Hiroki Watanabe, Ishikawa-ken (JP); Yuichi Takamine, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/043,133

(22) Filed: Jan. 14, 2002

(65) Prior Publication Data

US 2002/0109431 A1 Aug. 15, 2002

(30) Foreign Application Priority Data

Jan. 26, 2001 (JP) .......................... 2001-019057
Nov. 19, 2001 (JP) .......................... 2001-353656

(51) Int. Cl.⁷ .......................... H03H 9/64; H03H 9/72
(52) U.S. Cl. .......................... 333/133; 333/193
(58) Field of Search .......................... 333/193–196, 333/133

(56) References Cited

U.S. PATENT DOCUMENTS

| | | | | |
|---|---|---|---|---|
| 5,994,980 A | * | 11/1999 | Tada | 333/193 |
| 6,353,372 B1 | * | 3/2002 | Baier et al. | 333/195 |
| 6,424,239 B1 | * | 7/2002 | Ehara et al. | 333/193 |
| 6,483,402 B2 | * | 11/2002 | Endoh et al. | 333/193 |

FOREIGN PATENT DOCUMENTS

| | | | |
|---|---|---|---|
| DE | 198 18 038 | | 4/1998 |
| EP | 1 168 611 | | 1/2002 |
| JP | 1073470 | | 6/1998 |
| JP | 11-97966 | * | 4/1999 |
| JP | 2000-91883 | | 3/2000 |
| JP | 2001-267885 | * | 9/2001 |
| JP | 2001-292050 | * | 10/2001 |
| TW | 483238 | | 4/2002 |
| WO | WO 98/57429 | | 12/1998 |
| WO | WO 02/03549 A1 | | 1/2002 |

* cited by examiner

*Primary Examiner*—Barbara Summons
(74) *Attorney, Agent, or Firm*—Keating & Bennett, LLP

(57) ABSTRACT

A surface acoustic wave filter device has a balance-unbalance conversion function and substantially equal input impedance and output impedance so as to increase out-of-passband attenuation. The surface acoustic wave filter device includes an unbalanced signal terminal, first and second balanced signal terminals, and first and second surface acoustic wave filters having input and output impedances. In each filter, one of the input and output impedances is approximately four times the other impedance. Additionally, $2^{n-1}$ first surface acoustic wave filters are connected between the unbalanced signal terminal and the first balanced signal terminal, and $2^{n-1}$ second surface acoustic wave filters are connected between the unbalanced signal terminal and the second balanced signal terminal, where n is an integer of 1 or more. The second surface acoustic wave filters are 180 degrees out-of-phase with respect to the first surface acoustic wave filters.

16 Claims, 9 Drawing Sheets

SURFACE ACOUSTIC WAVE FILTER DEVICE

BACKGROUND OF THE INVENTION

1. Field of the Invention

The present invention relates to surface acoustic wave filter devices used as band pass filters in mobile phones and other electronic apparatuses. More particularly, the present invention relates to surface acoustic wave filter devices having a balanced-unbalanced conversion function and substantially equal input and output impedances.

2. Description of the Related Art

Recently, with the miniaturization and weight reduction of mobile phones, the development of composite components having composite multiple functions has been underway in addition to the reduction of the numbers of included components and the miniaturization thereof. Under such circumstances, more and more research has been conducted to produce a surface acoustic wave filter device having a balance-unbalance conversion function, commonly referred to as a balun function, as a surface acoustic wave filter device used in the RF stage of a mobile phone. Such a surface acoustic wave filter device has been incorporated in a mobile phone for use in the GSM system and other cellular phone systems.

For example, Japanese Unexamined Patent Application Publication No. 9-205342 describes a surface acoustic wave filter device having the balance-unbalance conversion function.

FIG. 18 schematically shows a plan view illustrating the electrode structure of an example of a longitudinally-coupled resonator-type surface acoustic wave filter device having a balance-unbalance conversion function. In a surface acoustic wave filter device 100, input impedance and output impedance are substantially equal and a balance-unbalance conversion function is provided. On a piezoelectric substrate, three interdigital transducers (IDTs) 102 to 104 are arranged along a surface acoustic wave propagating direction. Outside the area where the IDTs 102 to 104 are arranged, reflectors 101 and 105 are arranged along the surface acoustic wave propagating direction. The IDTs 102 and 104 are commonly connected with each other and are connected to an unbalanced signal terminal 106. Each edge of the IDT 103 is connected to a first balanced signal terminal 107 and a second balanced signal terminal 108.

In the filter device having the balance-unbalance conversion function, regarding the in-passband transmission characteristics between the unbalanced signal terminal and the first balanced signal terminal and the in-passband transmission characteristics between the unbalanced signal terminal and the second balanced signal terminal, the amplitude characteristics need to be equal and one of the filters needs to be 180 degrees out-of-phase with respect to the other filter. Additionally, out of the pass band, the amplitude characteristics and the phase characteristics need to be equal.

The amplitude balance and the phase balance are expressed as below, when the filter device having the balance-unbalance conversion function is regarded as a device having three ports, and for example, an unbalanced input terminal is a port 1 and first and second balanced output terminals are a port 2 and a port 3.

Amplitude balance=$|A|$. In this case, $A=|20\log S21|-|20\log S31|$.

Phase balance=$|B-180|$. $B=|\angle S21-\angle S31|$.

S21 represents a transmission coefficient from the first port to the second port. S31 represents a transmission coefficient from the first port to the third port. The symbol A represents the difference between a decibel value of the S21 and a decibel value of the S31.

Ideally, in the pass band of the filter device, the amplitude balance is 0 dB and the phase balance is 0 degree. Out of the pass band thereof, the amplitude balance is 0 dB and the phase balance is 180 degrees.

However, in the surface acoustic wave filter device 100 shown In FIG. 18, the balances are not ideal and insufficient. The reason for this is that since the bridging capacitance between the IDT 103 and the IDTs 102 and 104 at each side is added to the balanced signal terminal 107 and a capacitance is inserted between the balanced signal terminal 108 and a ground potential, the balanced signal terminals 107 and 108 have different parasitic capacitances. Thus, due to the difference between the parasitic capacitances, the balances, particularly, the balances out of the pass band are lost and thereby attenuation out of the pass band decreases.

SUMMARY OF THE INVENTION

In order to overcome the problems described above, preferred embodiments of the present invention provide a surface acoustic wave filter device having a balance-unbalance conversion function that is arranged such that the balances out of the pass band are greatly improved and reduction in attenuation out of a pass band is prevented. Other preferred embodiments of the present invention provide a communication apparatus including such a novel surface acoustic wave filter device.

According to a preferred embodiment of the present invention, a surface acoustic wave filter device has equal input impedance and output impedance and includes an unbalanced signal terminal, first and second balanced signal terminals, $2^{n-1}$ first surface acoustic wave filters connected between the unbalanced signal terminal and the first balanced signal terminal, and $2^{n-1}$ second surface acoustic wave filters connected between the unbalanced signal terminal and the second balance signal terminal, where n is an integer equal to 1 or more. In this filter device, one of the input and output impedances of each of the first and second filters is approximately four times the other impedance and the second surface acoustic wave filters are 180 degrees out-of-phase with respect to the first surface acoustic wave filters.

In addition, each of the first and second surface acoustic wave filters may have one or more interdigital transducers arranged in a direction in which a surface acoustic wave propagates and at least one of the interdigital transducers may be halved in an electrode-finger interdigitating widthwise direction to define first and second IDT sections which are connected in series with each other.

Furthermore, each of the first and second surface acoustic wave filters may have a structure in which a preliminary surface acoustic wave filter having substantially equal input impedance and output impedance is constructed in such a manner that at least one interdigital transducer is halved in an electrode-finger interdigitating widthwise direction to define first and second interdigital transducer sections.

The preliminary surface acoustic wave filter may be a longitudinally-coupled resonator-type surface acoustic wave filter. In addition, the longitudinally-coupled resonator-type surface acoustic wave filter may have three interdigital transducers arranged in a surface acoustic wave propagating direction and a central interdigital transducer or interdigital transducers at both sides may be halved in the electrode-finger interdigitating widthwise direction to define the first and second interdigital transducer sections.

Furthermore, each of the first and second surface acoustic wave filters may have one or more interdigital transducers and at least one interdigital transducer may be halved in a surface acoustic wave propagating direction to define first and second interdigital transducer sections.

In addition, each of the first and second surface acoustic wave filters may have a structure in which a preliminary surface acoustic wave filter having substantially equal input impedance and output impedance is constructed in such a manner that at least one interdigital transducer is halved in a surface acoustic wave propagating direction. Although the preliminary surface acoustic wave filter is not specifically designated, preferably, it is a longitudinally-coupled resonator-type surface acoustic wave filter.

The preliminary longitudinally-coupled resonator-type surface acoustic wave filter may have three interdigital transducers and a central interdigital transducer may be halved in the surface acoustic wave propagating direction.

In addition, preferably, either the first interdigital transducer sections or the second interdigital transducer sections may be connected to a ground potential. With this arrangement, one of the input impedance and the output impedance of the SAW filter between the balanced terminal and the unbalanced terminal is preferably approximately four times the other impedance thereof.

In addition, each of the first and second surface acoustic wave filters may have a structure in which a surface acoustic wave filter having a plurality of interdigital transducers is constructed in such a manner that at least two of the interdigital transducers are connected in series.

In addition, each of the first and second surface acoustic wave filters may have a structure in which a preliminary surface acoustic wave filter having substantially equal input impedance and output impedance is constructed in such a manner that at least two of the interdigital transducers are connected in series. Furthermore, preferably, the preliminary surface acoustic wave filter is a longitudinally-coupled resonator-type surface acoustic wave filter.

In this case, the longitudinally-coupled resonator-type surface acoustic wave filter may have three interdigital transducers and the interdigital transducers arranged at both sides in a surface acoustic wave propagating direction may be connected in series.

According to another preferred embodiment of the present invention, a communication apparatus includes the surface acoustic wave filter device of other preferred embodiments of the present invention defining a band pass filter.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1:
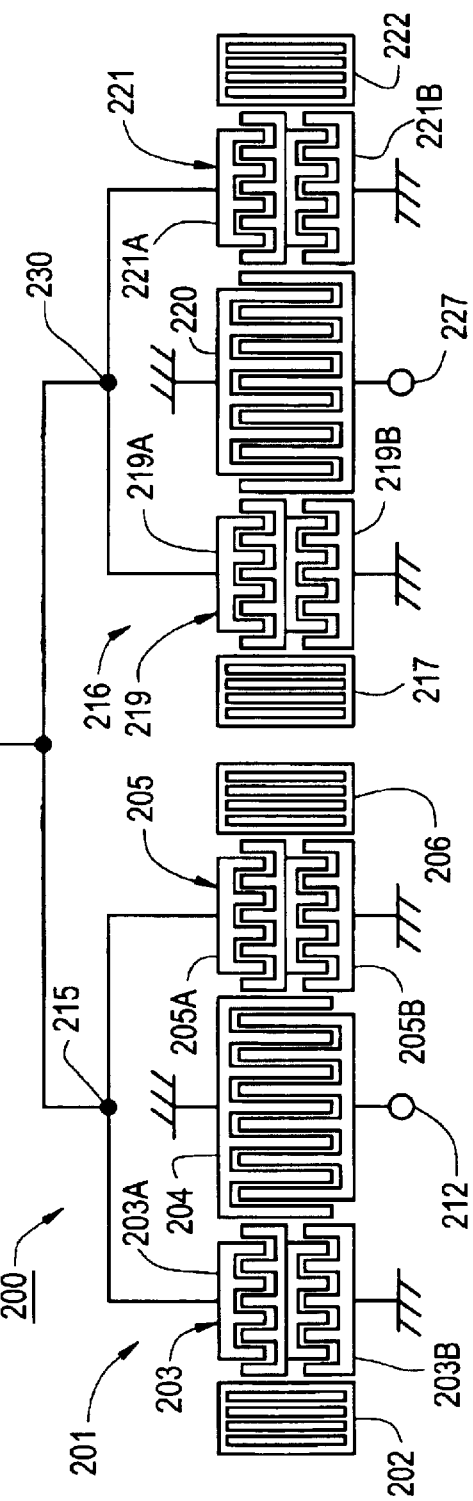
FIG. 1 schematically shows a plan view of a surface acoustic wave filter device according to a first preferred embodiment of the present invention.

Now, referring to the drawings, details of preferred embodiments of the present invention will be described with reference to a surface acoustic wave filter device according to a first preferred embodiment of the present invention.

FIG. 1 is a schematic plan view illustrating a surface acoustic wave device, for use, for example, as a DCS reception filter having a pass band of about 1 GHz to about 3 GHz.

In this preferred embodiment, the surface acoustic wave filter device preferably includes an electrode structure shown in FIG. 1 on a substrate that is preferably made of 40 ±5-degree Y-cut X-propagation LiTaO₃ (which is not shown).

A surface acoustic wave filter device 200 preferably includes a first acoustic wave filter 201 and a second surface acoustic wave filter 216, which is 180 degrees out-of-phase with respect to the first surface acoustic wave filter.

The first acoustic wave filter 201 has interdigital transducers (IDTs) 203 to 205 arranged in a direction in which a surface acoustic wave propagates. Reflectors 202 and 206 are arranged at each side of the area where the IDTs 203 to 205 are arranged, in the surface acoustic wave propagating direction.

The IDT 203 is split into two IDT sections 203A and 203B in a direction that is substantially perpendicular to the surface acoustic wave propagating direction. Similarly, the IDT 205 is split into two IDT sections 205A and 205B in the direction that is substantially perpendicular to the surface acoustic wave propagating direction. The IDT sections 203A and 203B are connected in series to each other and the IDT sections 205A and 205B are also connected in series to each other.

The IDT section 203A of the IDT 203 are commonly connected with the IDT section 205A of the IDT 205 to be connected to a terminal 215. The terminal 215 is connected to an unbalanced signal terminal 231. The IDT sections 203B and 205B are connected to edges of the IDT sections 203A and 205A, which are opposed to the edges thereof connected to the unbalanced signal terminal 231. The remaining edges of the IDT sections 203B and 205B are connected to ground potentials.

One edge of a central IDT 204 is connected to a ground potential and the other edge thereof is connected to a first balanced signal terminal 212. In the surface acoustic wave filter 201, the impedance of the terminal 215 is preferably approximately four times the impedance of the balanced signal terminal 212.

Figure 2:
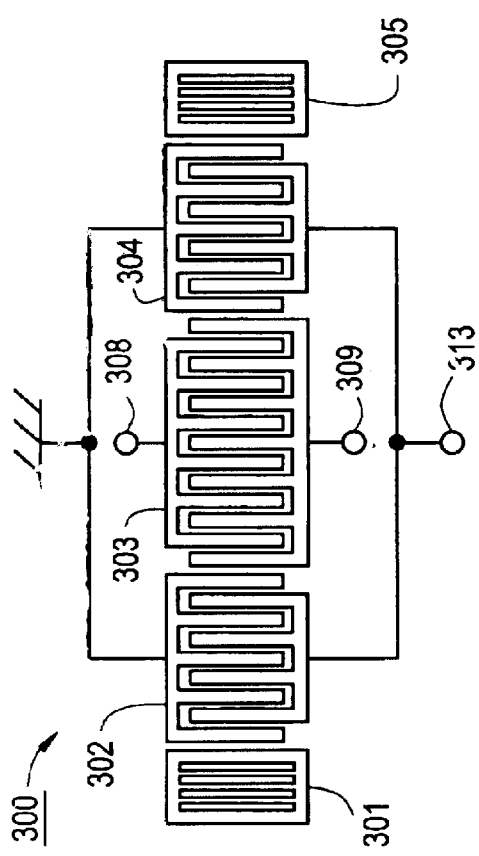
FIG. 2 schematically shows a plan view of a surface acoustic wave filter device provided that is related art for comparison to the present invention.

The surface acoustic wave filter 201 is equivalent to a modification of a preliminary longitudinally-coupled resonator-type surface acoustic wave filter 300 shown in FIG. 2. Specifically, the surface acoustic wave filter 300 is designed in such a manner that input impedance and output impedance are substantially equal and the filter 300 has three IDTs 302 to 304 arranged along a surface acoustic wave propagating direction. Reference numerals 301 and 305 denote reflectors. In the surface acoustic wave filter 300, the IDTs 302 and 304 arranged at each side, as shown above, are split into the first IDT sections and the second IDT sections in a direction that is substantially perpendicular to the surface acoustic wave propagating direction. Then, the first and second IDT sections are connected in series to define the surface acoustic wave filter 201. With this arrangement, the impedance at the terminal 215 is preferably approximately four times as high as the impedance at the balanced signal terminal 212.

The second surface acoustic wave filter 216 is preferably constructed similar to the first surface acoustic wave filter 201 except that the polarity of a central IDT 220 is inverted. In other words, reflectors 217 and 222 are constructed like the reflectors 202 and 206. An IDT 219 split into IDT sections 219A and 219B and an IDT 221 split into IDT sections 221A and 221B are constructed like the IDTs 203 and 205.

As mentioned above, the polarity of the IDT 220 is inverted relative to the polarity of the IDT 204. Consequently, the surface acoustic wave filter 216 is 180 degrees out-of-phase with respect to the surface acoustic wave filter 201.

The IDTs 219A and 221A of the second surface acoustic wave filter 216 are commonly connected with each other and are connected to a terminal 230. The terminal 230 is connected to the unbalanced signal terminal 231. The IDT sections 219B and 221B of the IDTs 219 and 221 are connected to ground potentials. In addition, one edge of the IDT 220 is connected to a ground potential and the other edge thereof is connected to a second balanced signal terminal 227.

In this preferred embodiment, the central IDT 204 of the first surface acoustic wave filter 201 is connected to the first balanced signal terminal 212 and the central IDT 220 of the second surface acoustic wave filter 216 is connected to the second balanced signal terminal 227. The terminals 215 and 230 are connected to the unbalanced signal terminal 231. This arrangement enables the formation of the surface acoustic wave filter device 200 having substantially equal input and output impedances and the balanced-unbalanced conversion function. In FIG. 1, for simpler illustration, the IDTs and the reflectors are schematically shown. Thus, the number of electrode fingers differs from the number of electrode fingers included in the real filter device.

Next, detailed characteristics of the surface acoustic wave filter device 200 will be described based on experimental results.

For comparison, the preliminary longitudinally-coupled resonator-type surface acoustic wave filter 300 shown in FIG. 2 is used as a related art. A description will be provided in detail about the design of the longitudinally-coupled resonator-type surface acoustic wave filter 300.

Electrode-finger interdigitating width W: 74.8 $\lambda$I ($\lambda$I: the wavelength of IDT)

Numbers of electrode fingers of IDTs 302, 303, and 304: 23, 33, and 23

IDT wavelength $\lambda$I: 2.14 $\mu$m

Reflector wavelength $\lambda$R: 2.19 $\mu$m

Number of reflector electrode fingers: 150

Gap between adjacent IDTs (distance between the centers of adjacent electrode fingers): 0.32 $\lambda$I Gap between IDT and reflector (distance between the centers of adjacent electrode fingers): 0.53 $\lambda$I Duty of IDT: 0.63

Duty of reflector: 0.57

Thickness of electrode finger: 0.088 $\lambda$I

In the surface acoustic wave filter device 300 as designed above, the IDTs 302 and 304 are commonly connected with each other to be connected to an unbalanced signal terminal 313. Both edges of the IDT 303 are connected to first and second balanced signal terminals 308 and 309. In this arrangement, the characteristics of the filter device 300 were measured.

Furthermore, under the same condition as that of the longitudinally-coupled resonator-type surface acoustic wave filter 300 as the related art prepared as described above, the surface acoustic wave filter device 200 was designed. However, as mentioned above, in the surface acoustic wave filters 201 and 216, the IDTs 203, 205, 219, and 221 were halved in the direction that is substantially perpendicular to the surface acoustic wave propagating direction. The polarity of the IDT 220 was inverted relative to the polarity of the IDT 204. In the surface acoustic wave filter device 200 of the first preferred embodiment, the electrode-finger interdigitating width was 37 λI to equalize the input and output impedances of the first preferred embodiment and the related art. In terms of the other construction and arrangement of elements, the surface acoustic wave filter device 200 of the present preferred embodiment was constructed similar to the surface acoustic wave filter device 300.

Figure 3:
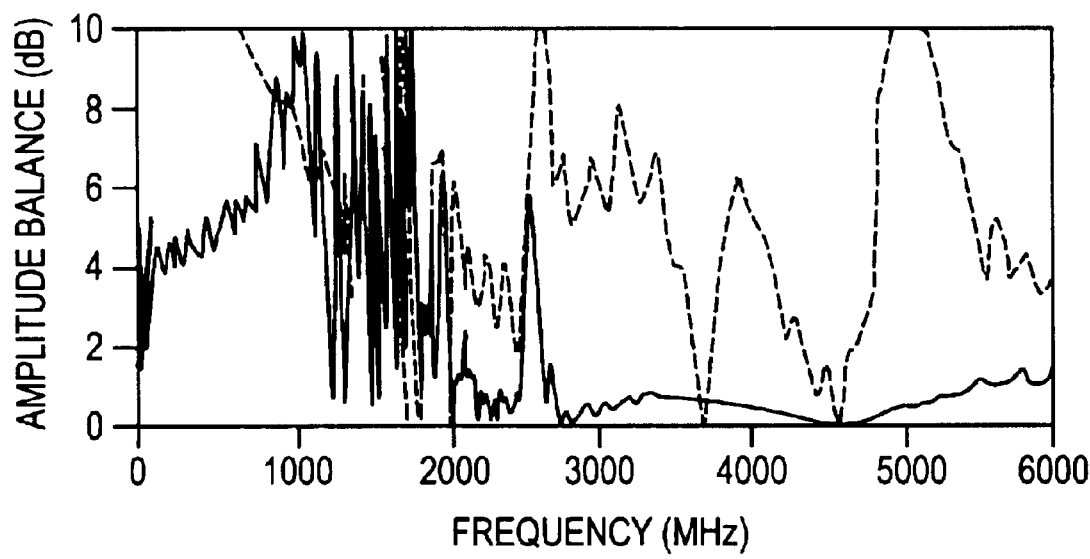
FIG. 3 is a graph showing an amplitude balance comparison between the first preferred embodiment of the present invention and the related art.
Figure 4:
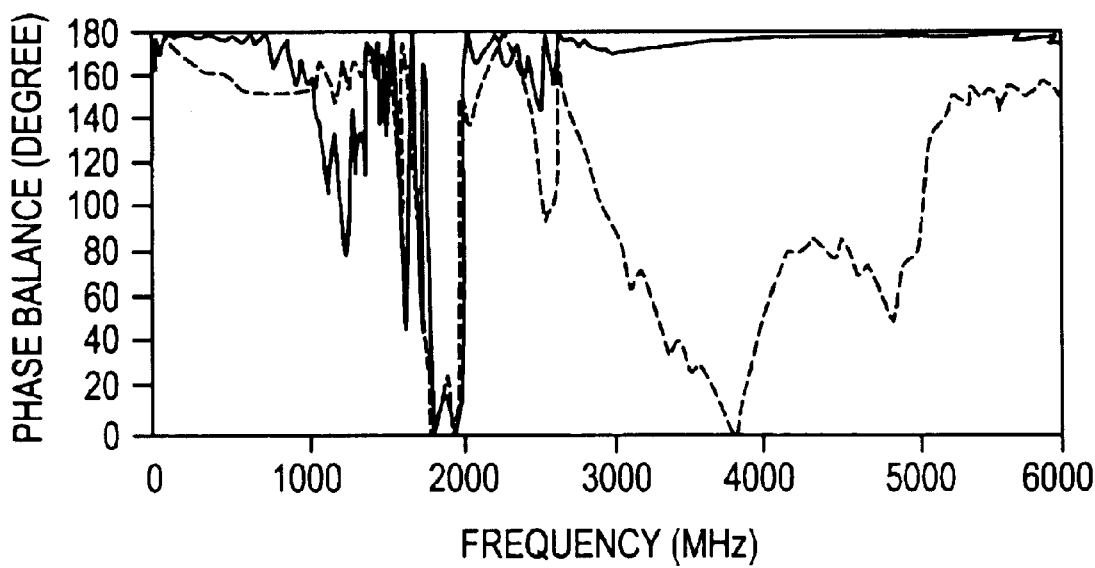
FIG. 4 is a graph showing a phase balance comparison between the first preferred embodiment of the present invention and the related art.
Figure 5:
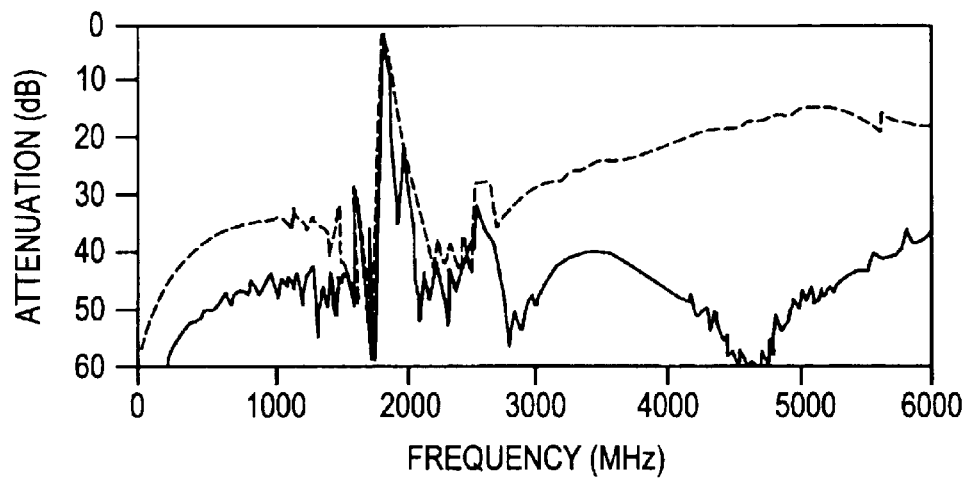
FIG. 5 is a graph showing attenuation-frequency characteristics of the surface acoustic wave filter devices of the first preferred embodiment of the present invention and the related art.

FIG. 3 shows amplitude balances in both of the surface acoustic wave filter devices 200 and 300. FIG. 4 shows phase balances thereof and FIG. 5 shows attenuation-frequency characteristics thereof. In FIGS. 3 to 5, the characteristics of the related art are indicated by broken lines and the characteristics of the first preferred embodiment are indicated by solid lines.

Obviously, regarding the amplitude balances shown in FIG. 3, the amplitude balance of the related art greatly changes in a range from approximately 3 GHz to approximately 6 GHz and it is more than about 10 dB near 5 GHz. In contrast, the amplitude balance of the first preferred embodiment in the area from approximately 3 GHz to approximately 6 GHz is restricted to approximately 1 dB or less. In addition, it was discovered that the amplitude balance in the present preferred embodiment can be improved even in the area of frequencies below about 1 GHz.

Similar results were seen in the phase balances shown in FIG. 4. In the related art, in a range from approximately 3 GHz to 6 GHz, the phase balance greatly changes in a range from 0 to 180 degrees. In contrast, in the same frequency range, the phase balance of the present preferred embodiment lies within a range of approximately 170 degrees to approximately 180 degrees. Even in the area of frequencies below 1 GHz, obviously, the phase balance of the present preferred embodiment can be significantly improved.

As shown above, in the frequency areas out of the pass band (from about 1 GHz to about 3 GHz), the amplitude balance of the first preferred embodiment is close to about 0 dB and the phase balance thereof is close to about 180 degrees. As a consequence, as shown in FIG. 5, attenuation out of the pass band is found to significantly increase. When compared with the related art, it is shown that, in this preferred embodiment, in the frequency area below 1 GHz, the attenuation increases by about 10 dB. In the frequency area below about 3 GHz, the attenuation increases by approximately 15 dB and especially, near 4.5 GHz, it increases by more than approximately 40 dB.

The reason that the amplitude balance and phase balance are improved and thereby the attenuation out of the pass band is increased in the surface acoustic wave filter device 200 of the first preferred embodiment as described above is as follows.

In the related art shown in FIG. 2, different parasitic capacitances are generated at the balanced signal terminal 308 and the balanced signal terminal 309. In other words, the parasitic capacitance added to the balanced signal terminal 309 mainly functions as a bridging capacitance between the central IDT 303 and the IDTs 302 and 304 at each side. In contrast, the parasitic capacitance added to the balanced signal terminal 308 is mainly a capacitance inserted between the balanced signal terminal 308 and the ground potential. Thus, due to different influences of the parasitic capacitances, it seems that the balances, particularly, the amplitude balance and the phase balance out of the pass band are lost, with the result that the attenuation decreases.

In the present preferred embodiment, however, there are ground potentials present around the first and second balanced signal terminals 212 and 227. Thus, the parasitic capacitances added to both balanced signal terminals mainly function as capacitances between the terminals and the ground potentials. Accordingly, equal parasitic capacitance is added to the first and second balanced signal terminals 212 and 227. Consequently, since there is little difference between the parasitic capacitances added to the balanced signal terminals 212 and 227, it seems that the amplitude balance out of the pass band becomes close to about 0 dB and the phase balance becomes close to about 180 degrees, with the result that the attenuation out of the pass band significantly increases.

Figure 6:
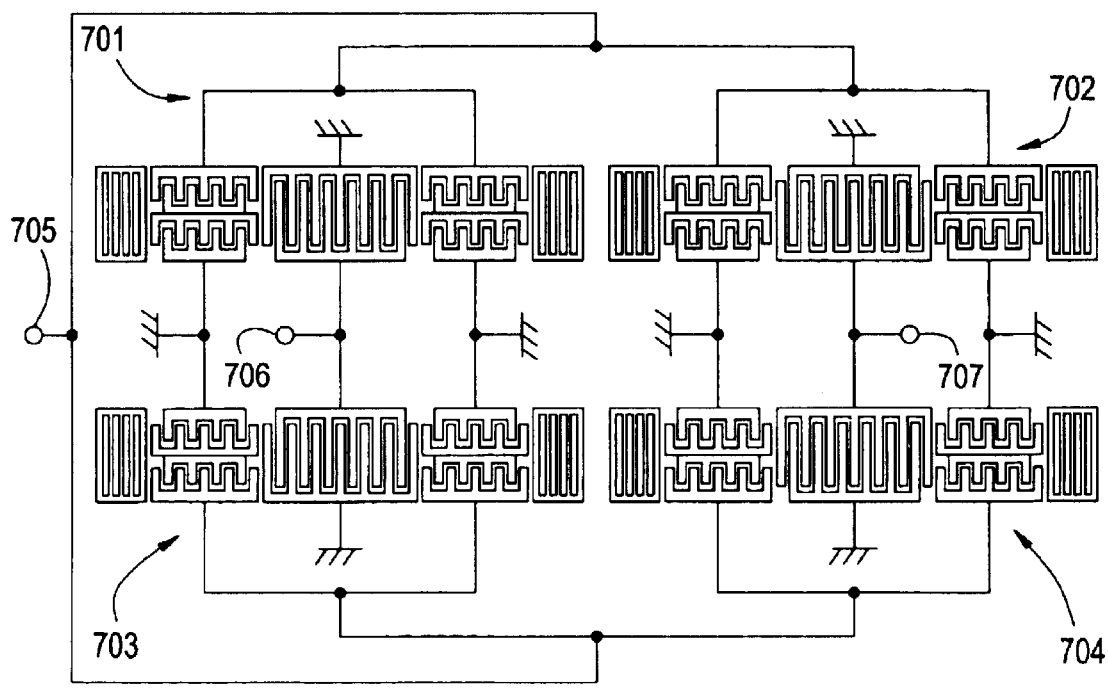
FIG. 6 schematically shows a plan view illustrating a modification of the surface acoustic wave filter device of the first preferred embodiment of the present invention.

In the first preferred embodiment, the surface acoustic wave filter device 200 preferably includes two longitudinally-coupled resonator-type surface acoustic wave filters of the 3-IDT type. Alternatively, as shown in FIG. 6, first and second surface acoustic wave filters 703 and 704 may be connected in parallel to first and second surface acoustic wave filters 701 and 702. The first and second surface acoustic wave filters 701 and 702 are constructed similar to the surface acoustic wave filters 201 and 216 of the above-described preferred embodiment. In addition, the surface acoustic wave filters 703 and 704 are also constructed similar to the surface acoustic wave filters 201 and 216.

One edge of the surface acoustic wave filter 701 and one edge of the surface acoustic wave filter 702 are commonly connected with each other, and similarly, one edge of the surface acoustic wave filter 703 and one edge of the surface acoustic wave filter 704 are commonly connected with each other. Then, they are connected to an unbalanced signal terminal 705. The first and second balanced signal terminals 706 and 707 are connected to the central IDTs of the surface acoustic wave filters 701 and 703 and the central IDTs of the surface acoustic wave filters 702 and 704. As shown here, even with the structure using the four surface acoustic wave filters, when the filters are constructed similar to the filter of the first preferred embodiment, attenuation out of the pass band can be increased similarly.

Figure 7:
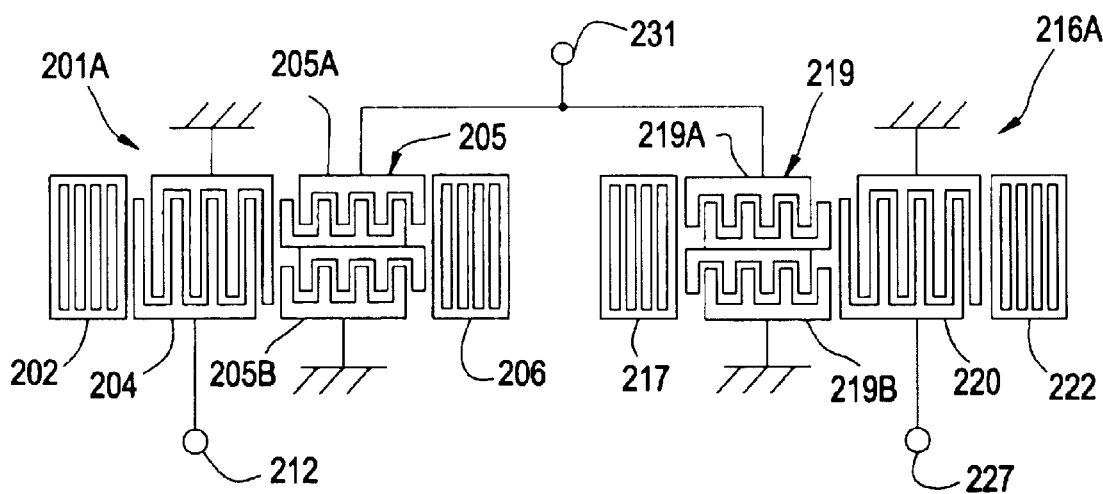
FIG. 7 schematically shows a plan view illustrating another modification of the surface acoustic wave filter device of the first preferred embodiment of the present invention.

Furthermore, in the present invention, the number of IDTs of each of the first and second surface acoustic wave filters is not restricted to three. For instance, in a modification as shown in FIG. 7, there are filters having two IDTs, including a first surface acoustic wave filter 201A and a second surface acoustic wave filter 216A. The first surface acoustic wave filter 201A has a structure in which the IDT 203 is removed from the surface acoustic wave filter 201. The second surface acoustic wave filter 216A has a structure in which the IDT 221 is removed from the surface acoustic wave filter 216. The gaps between the reflectors and the IDTs are similar to the gaps set in the first preferred embodiment.

One edge of the IDT 204 is connected to the first balanced signal terminal 212 and one edge of the IDT 220 is connected to the second balanced signal terminal 227. One edge of each of the IDTs 205 and 219 is connected to an unbalanced signal terminal 231.

Figure 8:
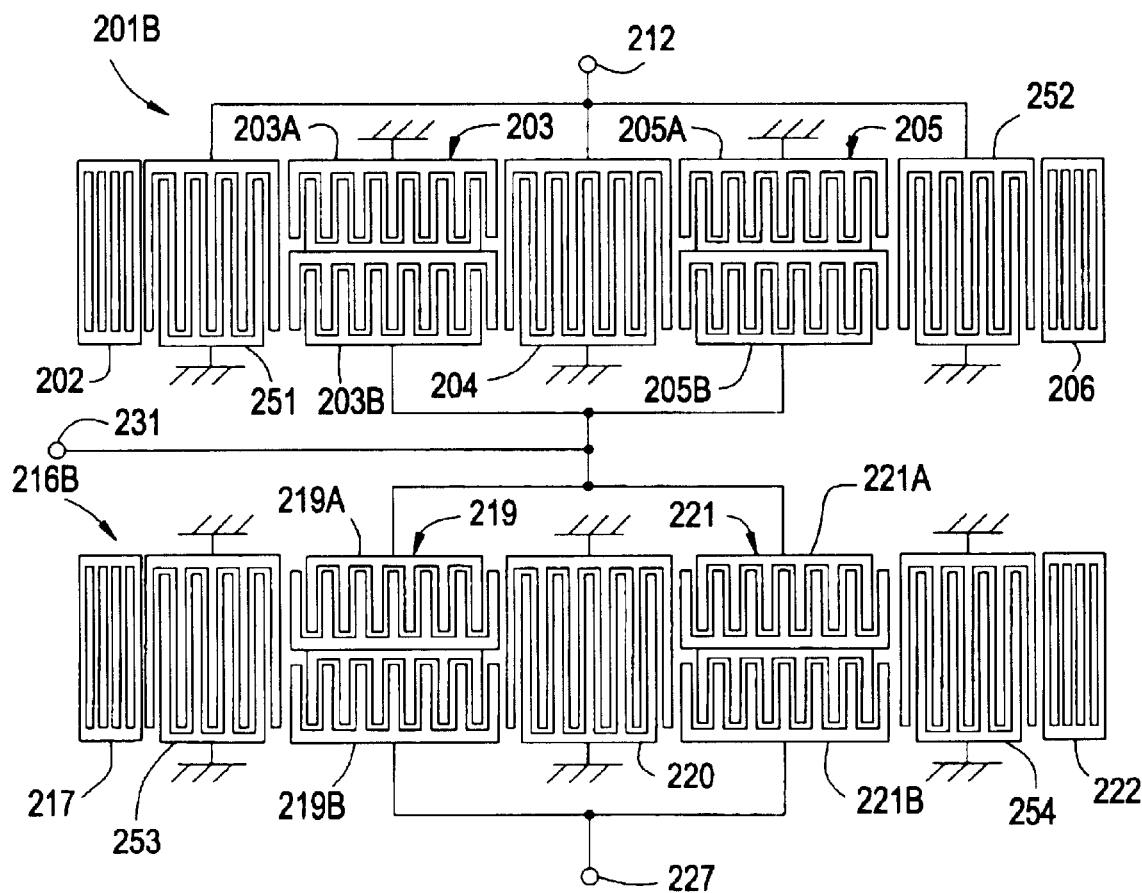
FIG. 8 schematically shows a plan view illustrating another modification of the surface acoustic wave filter device of the first preferred embodiment of the present invention.

As shown in FIG. 8, as each of the first and second surface acoustic wave filters 201B and 216B, surface acoustic wave filters of 5-IDT type may be used. Here, IDTs 251 and 252 are arranged on each side of the IDTs 203 and 205 in the surface acoustic wave propagating direction. Except for this arrangement, the surface acoustic wave filter 201B is constructed similar to the surface acoustic wave filters 201. Similarly, the second surface acoustic wave filter 216B is constructed similar to the surface acoustic wave filter 216 except that IDTs 253 and 254 are arranged outside the IDTs 219 and 221 in the surface acoustic wave propagating direction.

Regarding the modified surface acoustic wave filter device shown in each of FIGS. 7 and 8, in the first surface acoustic wave filter, one of the input impedance and the output impedance is preferably about four times the other impedance. Similarly, in the second surface acoustic wave filter, one of the input impedance and the output impedance is preferably about four times the other impedance, and the second filter is 180 degrees out-of-phase with respect to the first filter. In addition, $2^{n-1}$ first and second filters are connected with each other, and the total number of the first and second surface acoustic wave filters is $2^n$, where n is an integer of 1 or more. These surface acoustic wave filters are connected in the same manner as the first preferred embodiment and thereby attenuation out of the pass band can be similarly increased. In order to obtain desired frequency characteristics, the electrode-finger interdigitating width and the number of IDTs can be adjusted as needed. Furthermore, traps may be added when necessary.

Figure 9:
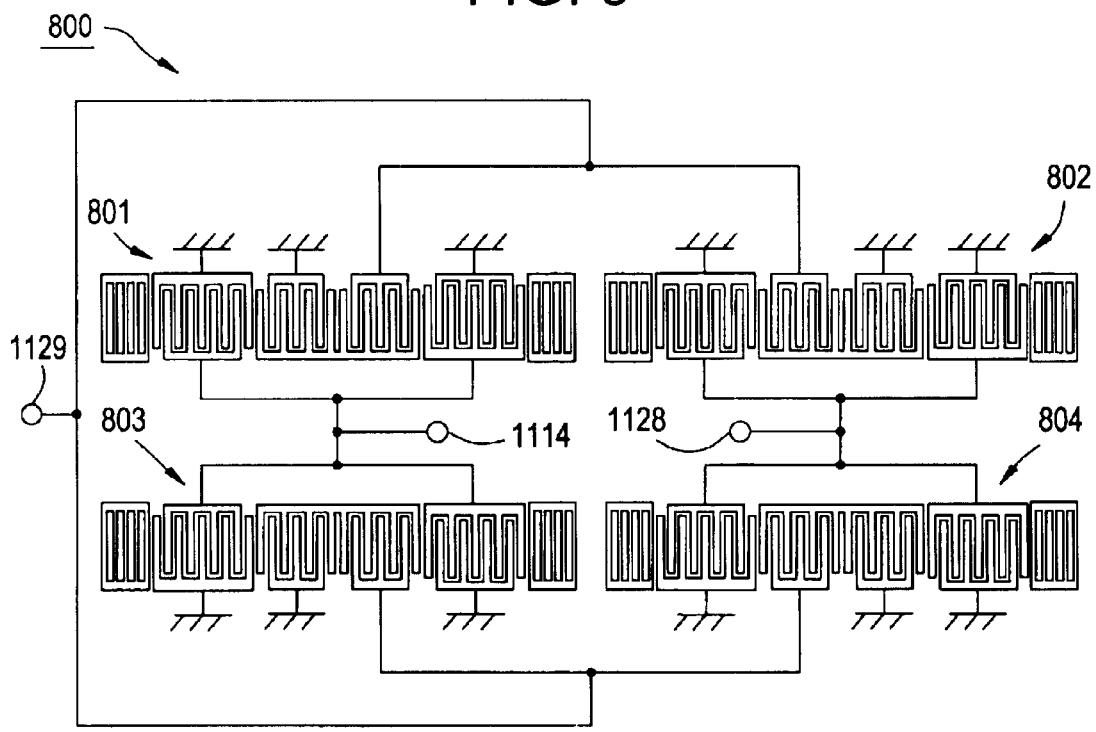
FIG. 9 schematically shows a plan view illustrating a surface acoustic wave filter device according to a second preferred embodiment of the present invention.

FIG. 9 schematically shows a plan view of the electrode structure of a surface acoustic wave filter device according to a second preferred embodiment of the present invention. In this preferred embodiment, similar to the first preferred embodiment, the surface acoustic wave filter device is a DCS reception filter having a pass band of about 1 GHz to about 3 GHz.

The electrode structure shown in FIG. 9 is preferably disposed on a substrate that is made of 40±5-degree Y-cut X-propagation LiTaO$_3$, which is not shown.

A surface acoustic wave filter device 800 includes first and second acoustic wave filters 801 and 802 and first and second surface acoustic wave filters 803 and 804. That is, the filter device 800 is a surface acoustic wave filter device having a four-element structure.

Figure 10:
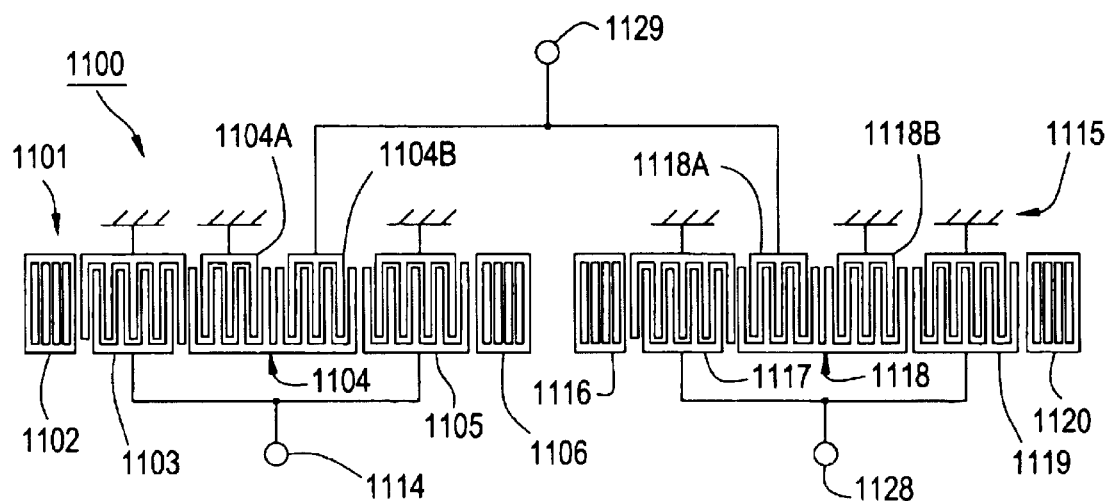
FIG. 10 schematically shows a plan view illustrating a modification of the surface acoustic wave filter device of the second preferred embodiment of the present invention.

The surface acoustic wave filter device 800 is constructed by connecting two surface acoustic wave filter devices 1100, which are equivalent to a modification shown in FIG. 10, in parallel to each other.

For easy understanding, first, a description will be provided of the structure of the surface acoustic wave filter device 1100 shown in FIG. 10. The surface acoustic wave filter device 1100 preferably includes a first surface acoustic wave filter 1101 and a second surface acoustic wave filter 1115, which is 180 degrees out-of-phase with respect to the first surface acoustic wave filter 1101.

The first surface acoustic wave filter 1101 is equivalent to a preliminary longitudinally-coupled resonator-type surface acoustic wave filter having substantially equal input impedance and output impedance and including three IDTs, of which the central IDT is halved in a surface acoustic wave propagating direction. Specifically, a central IDT 1104 is split into IDT sections 1104A and 1104B. IDTs 1103 and 1105 are arranged at each side of the IDT 1104 in the surface acoustic wave propagating direction. Reflectors 1102 and 1106 are arranged, in the surface acoustic wave propagating direction, outside the area where the IDTs 1103, 1104, and 1105 are disposed.

Of the IDT sections 1104A and 1104B, one edge of the IDT section 1104A is connected to a ground potential, and the other edge of the IDT section 1104A and one edge of the IDT section 1104B are continuously arranged while the other edge of the IDT section 1104B is connected to an unbalanced signal terminal 1129. One edge of each of the IDTs 1103 and 1105 is connected to a ground potential and the remaining edges of the IDTs 1103 and 1105 are commonly connected with each other and are connected to a first balanced signal terminal 1114.

Similarly, in the second surface acoustic wave filter 1115, a central IDT 1118 is halved in the surface acoustic wave propagating direction to define a first IDT section 1118A and a second IDT section 1118B. One edge of the IDT section 1118B is connected to a ground potential. One edge of the IDT section 1118A is connected to the unbalanced signal terminal 1129. One edge of each of the IDTs 1117 and 1119 is connected to a ground potential. The remaining edges thereof are commonly connected with each other and are connected to the second balanced signal terminal 1128. Reference numerals 1116 and 1120 denote reflectors.

The one edge of the IDT section 1104A is connected to the ground potential and the one edge of the IDT section 1104B is connected to the unbalanced signal terminal 1129. Thus, in the surface acoustic wave filter 1101, the impedance of the terminal 1129 is preferably about four times the impedance of the surface acoustic wave filter terminal 1114. Similarly, In the surface acoustic wave filter 1115, the impedance of the terminal 1129 is preferably different from the impedance of the terminal 1128.

Between the unbalanced signal terminal 1129 and the first and second balanced signal terminals 1114 and 1128, the first and second surface acoustic wave filters 1101 and 1115 are connected as shown above. Thus, as in the case of the first preferred embodiment, attenuation out of a pass band can be increased.

Next, a description will be provided of the surface acoustic wave filter device 800 according to the second preferred embodiment shown in FIG. 9. In the surface acoustic wave filter device 800, two surface acoustic wave filter devices 1100, each of which has the first and second surface acoustic wave filters 1101 and 1115, are connected in parallel. In other words, surface acoustic wave filters 801 and 803 are constructed similar to the surface acoustic wave filter 1101 and surface acoustic wave filters 802 and 804 are constructed similar to the surface acoustic wave filter 1115.

The surface acoustic wave filter device 800 according to the second preferred embodiment shown in FIG. 9 is preferably designed according to the same conditions as the conditions of the first preferred embodiment described above to measure the characteristics thereof. The obtained results will be indicated by solid lines in FIGS. 11 to 13. For comparison, the characteristics of the related art shown in FIG. 2 will be indicated by broken lines in FIGS. 11 to 13.

Figure 11:
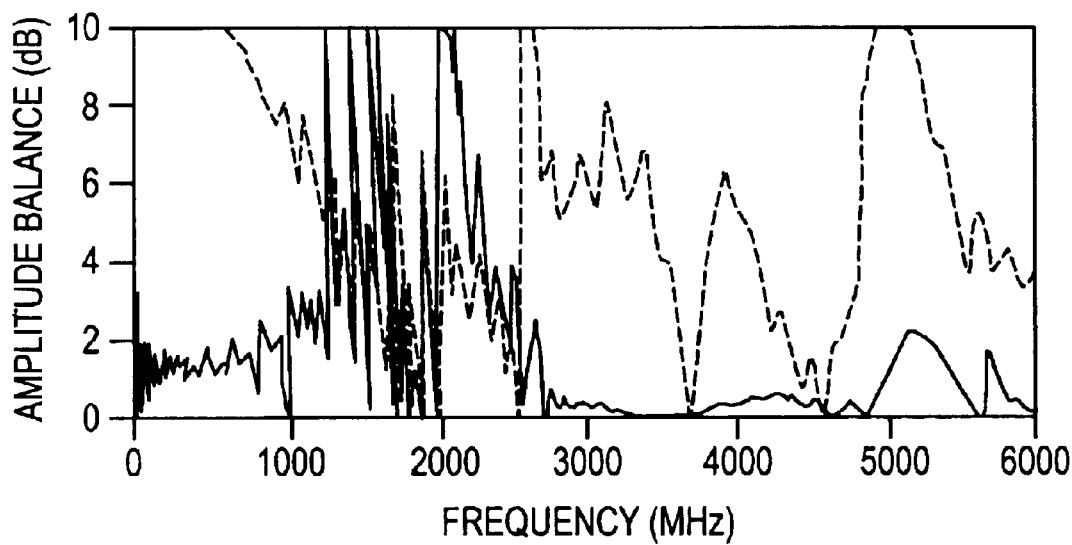
FIG. 11 is a graph showing an amplitude balance comparison between the second preferred embodiment of the present invention and the related art.
Figure 12:
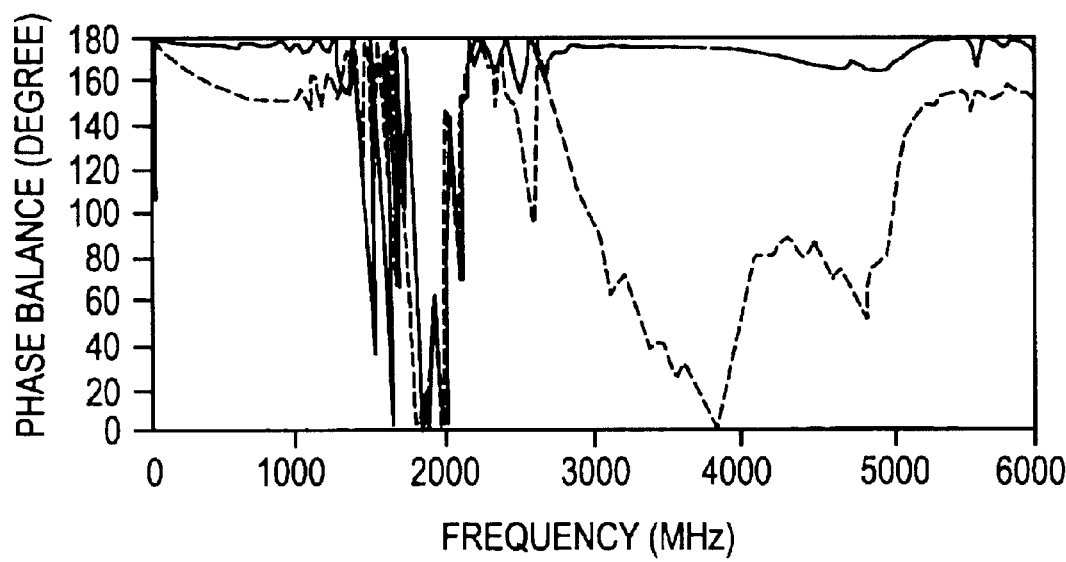
FIG. 12 is a graph showing a phase balance comparison between the second preferred embodiment and the related art.
Figure 13:
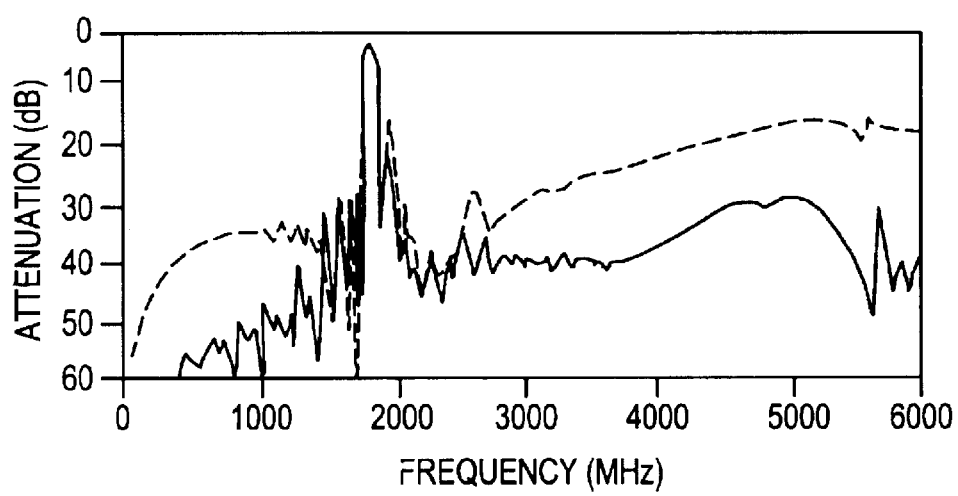
FIG. 13 is a graph showing attenuation-frequency characteristics of the surface acoustic wave filter devices of the second preferred embodiment of the present invention and the related art.

As clearly shown in FIGS. 11 to 13, even in the second preferred embodiment, parasitic capacitances added to the first and second balanced signal terminals are substantially equal. Thus, when compared with the related art, the amplitude balance and the phase balance out of the pass band can be improved. Specifically, as shown in FIG. 11, in this preferred embodiment, out of the pass band (in the frequency areas below 1 GHz and over 3 GHz), the amplitude balance becomes close to 0 dB, and as clearly shown in FIG. 12, the phase balance becomes near 180 degrees. Consequently, as shown in FIG. 13, attenuation out of the pass band can be significantly increased.

In the surface acoustic wave filter device 1100 having the two-element structure shown in FIG. 10, the same advantages as those obtained in the second preferred embodiment can be obtained. In addition, the present invention is not restricted to the surface acoustic wave filter device 800 having the four-element structure and the surface acoustic wave filter device 1100 having the two-element structure as shown in the second preferred embodiment. The same advantages as those in the above-described preferred embodiment can be obtained by connecting the $2^{n-1}$ first and second surface acoustic wave filters, in each of which one of the input and output impedances is preferably about four times as high as one of the output and input impedances, and one of the filters is 180 degrees out-of-phase with respect to the other filter.

Figure 14:
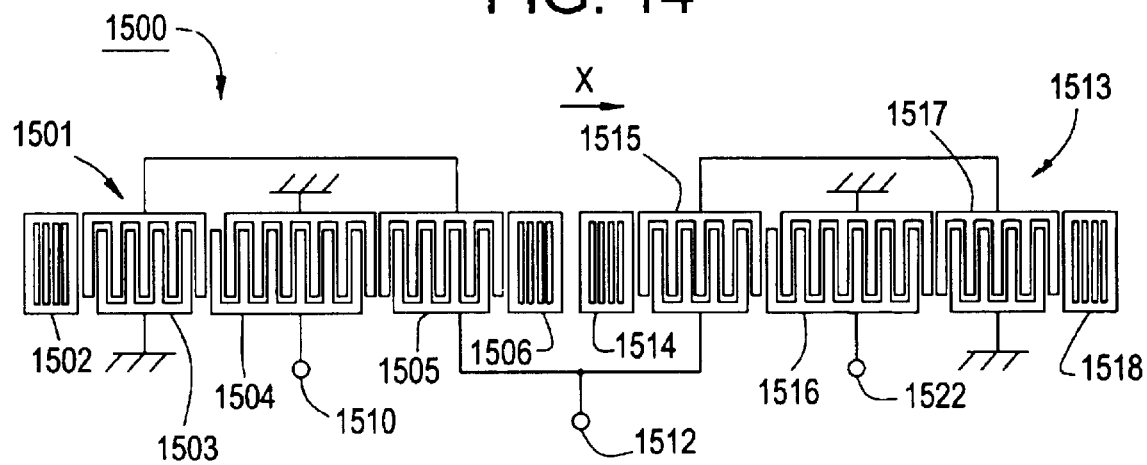
FIG. 14 schematically shows a plan view illustrating a surface acoustic wave filter device according to a third preferred embodiment of the present invention.

FIG. 14 schematically shows the electrode structure of a surface acoustic wave filter device according to a third preferred embodiment of the present invention. In this preferred embodiment, the surface acoustic wave filter device is preferably also for use as a DCS reception filter having a pass band of about 1 GHz to about 3 GHz.

The electrode structure shown in FIG. 14 is preferably disposed on a substrate made of 40±5-degree Y-cut X-propagation LiTaO$_3$, which is not shown, to provide a surface acoustic wave filter device 1500.

The surface acoustic wave filter device 1500 includes first and second surface acoustic wave filters 1501 and 1513 in each of which the impedance at one edge is about four times the impedance at the other edge. The first surface acoustic wave filter 1501 is 180 degrees out-of-phase with respect to the second surface acoustic wave filter 1513. The first surface acoustic wave filter 1501 has a structure in which a preliminary longitudinally-coupled resonator-type surface acoustic wave filter having three IDTs is designed such that the input impedance and the output impedance are substantially equal and IDTS arranged at both sides of the central IDT are connected in series. In other words, IDTs 1503 to 1505 are arranged in a surface acoustic wave propagating direction. One edge of each of the IDTs 1503 and 1505 at each side in the surface acoustic wave propagating direction is commonly connected with each other. Then, the other edge of the IDT 1503 is connected to a ground potential and the other edge of the IDT 1505 is connected to an unbalanced signal terminal 1512. Thus, the IDTs 1503 and 1505 are connected in series.

One edge of the central IDT 1504 is connected to a ground potential and the other edge thereof is connected to a first balanced signal terminal 1510. Reference numerals 1502 and 1506 denote reflectors.

The second surface acoustic wave filter 1513 is constructed similar to the first surface acoustic wave filter 1501. Specifically, one edge of the central IDT 1516 is connected to a ground potential and the other edge thereof is connected to a second balanced signal terminal 1522. One edge of each of IDTs 1515 and 1517 at each side is connected with each other and the remaining edge of the IDT 1517 is connected to a ground potential. The remaining edge of the IDT 1515 is connected to the unbalanced signal terminal 1512. Thus, the IDT 1515 and the IDT 1517 are connected in series between the ground potential and the unbalanced signal terminal 1512. Reference numerals 1514 and 1518 denote reflectors.

As shown above, when the surface acoustic wave propagating direction is set as an arrow X direction in FIG. 14, in the first surface acoustic wave filter 1501, the IDT 1505 present in front in the surface acoustic wave propagating direction is connected to the unbalanced signal terminal 1512. In the second surface acoustic wave filter 1513, the IDT 1515 arranged at a starting point of the surface acoustic wave direction is connected to the unbalanced signal terminal 1512. With this arrangement, the first surface acoustic wave filter 1501 is 180 degrees out-of-phase with respect to the second surface acoustic wave filter 1513.

Thus, in this preferred embodiment, one edge of the first surface acoustic wave filter 1501 and one edge of the second surface acoustic wave filter 1513 are commonly connected with each other to be connected to the unbalanced signal terminal 1512. One edge of each of the central IDTs 1504 and 1516 of the first and second surface acoustic wave filters 1501 and 1513 is connected to the first and second balanced signal terminals. As a result, in the surface acoustic wave filter device, the input impedance and the output impedance are equalized and the balance-unbalance conversion function is provided.

In the third preferred embodiment, similar to the first and second preferred embodiments, parasitic capacitances added to the first and second balanced signal terminals 1510 and 1522 are substantially equal. Accordingly, like the first and second preferred embodiments, since the amplitude balance and the phase balance are improved, attenuation out of the pass band significantly increases.

The surface acoustic wave filter device 1500 shown in FIG. 14 uses the first and second surface acoustic wave filters 1501 and 1513 of the 3-IDT type. However, as shown in FIG. 15, surface acoustic wave filters 1501A and 1513A of 5-IDT type may be used.

Figure 15:
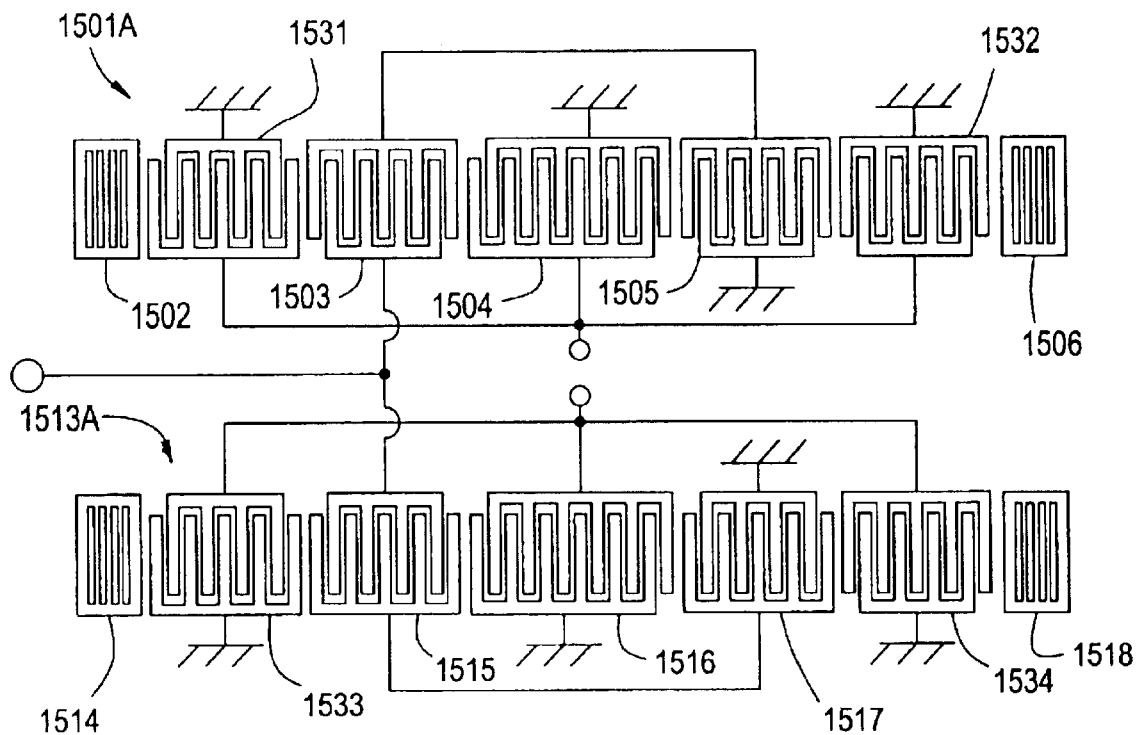
FIG. 15 schematically shows a plan view illustrating a modification of the surface acoustic wave filter device of the third preferred embodiment of the present invention.

In the surface acoustic wave filter device 1500A shown in FIG. 15, IDTs 1531, 1532, 1533, and 1534 are additionally arranged outside the IDTs 1503 and 1505 and the IDTs 1515 and 1517 shown in FIG. 14 in the surface acoustic wave propagating direction. Except for the arrangement, the surface acoustic wave filter device 1500A is preferably the same as the preferred embodiment shown in FIG. 14. In the third preferred embodiment, the number of IDTs of each longitudinally-coupled resonator-type surface acoustic wave filter is not restricted to a designated one.

Figure 16:
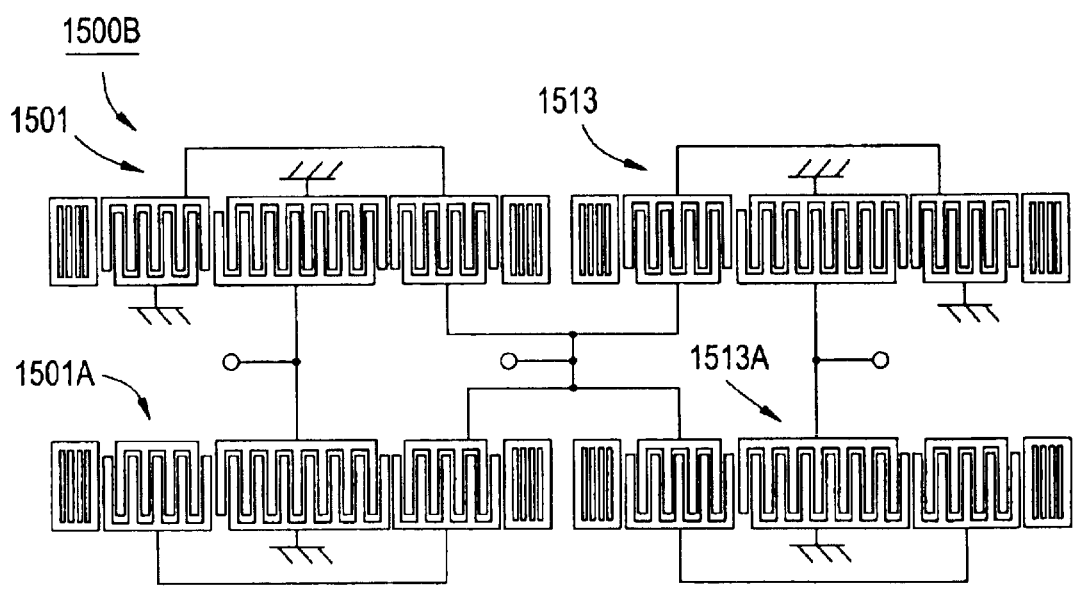
FIG. 16 schematically shows a plan view illustrating another modification of the surface acoustic wave filter device of the third preferred embodiment of the present invention.

In addition, as shown in FIG. 16, two first and second surface acoustic wave filters may be used to provide a surface acoustic wave filter device having a four-element structure. In a surface acoustic wave filter device 1500B shown in FIG. 16, two first surface acoustic wave filters 1501 and 1501A and two second surface acoustic wave filters 1513 and 1513A are connected to produce the surface acoustic wave filter device having the four-element structure.

Like the first and second preferred embodiments described above, in the third embodiment, also, in the first and second surface acoustic wave filters, one of the input and output impedances is preferably about four times as high as one of the output and input impedances. The second surface acoustic wave filter is 180 degrees out-of-phase with respect to the first second surface acoustic wave filter. In addition, $2^{n-1}$ first and second surface acoustic wave filters are connected with each other, where n is an integer of 1 or more. In total, $2^n$ surface acoustic wave filters are used to construct the surface acoustic wave filter device of the present invention. Similarly, the difference between parasitic capacitances added to the first and second balanced signal terminals can be reduced and thereby attenuation out of the pass band can be increased.

Each of the first to third preferred embodiments preferably uses the substrate made of 40±5-degree Y-cut X-propagation LiTaO$_3$, which is not shown. However, the substrate used in the present invention is not restricted to such a piezoelectric substrate. For example, the present invention may use a substrate formed of 64 to 72-degree Y-cut X-propagation LiNbO$_3$ or a substrate formed of 41-degree Y-cut X-propagation LiNbO$_3$, or other suitable material and substrates. With this arrangement, the same advantages can also be obtained.

Figure 17:
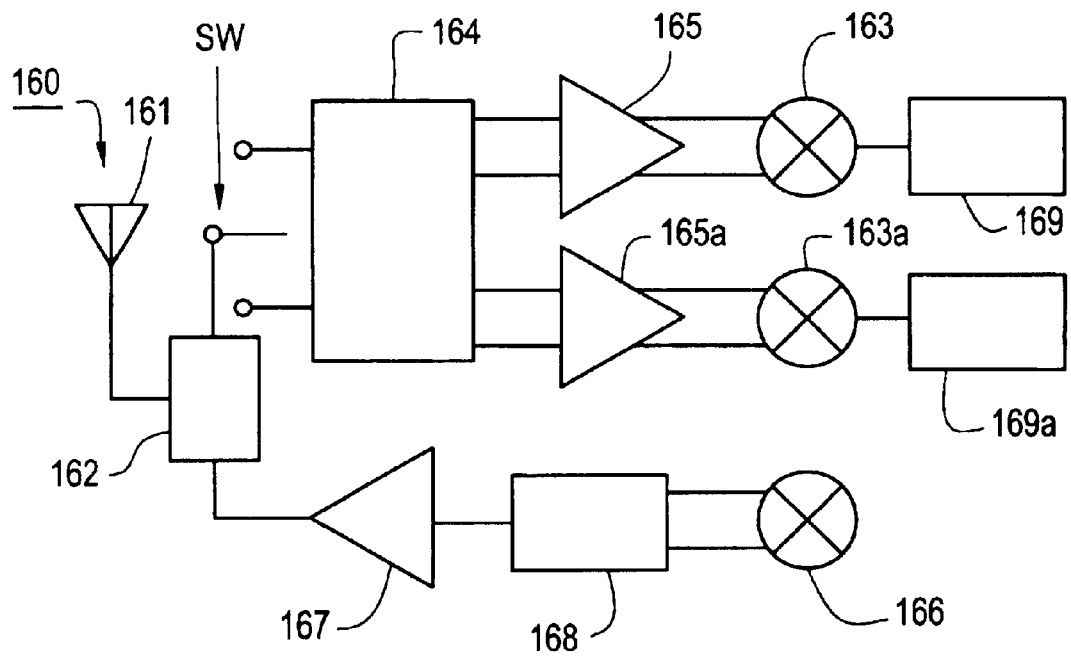
FIG. 17 shows a block diagram schematically illustrating the structure of a communication apparatus including the surface acoustic wave filter device of other preferred embodiments of the present invention.
Figure 18:
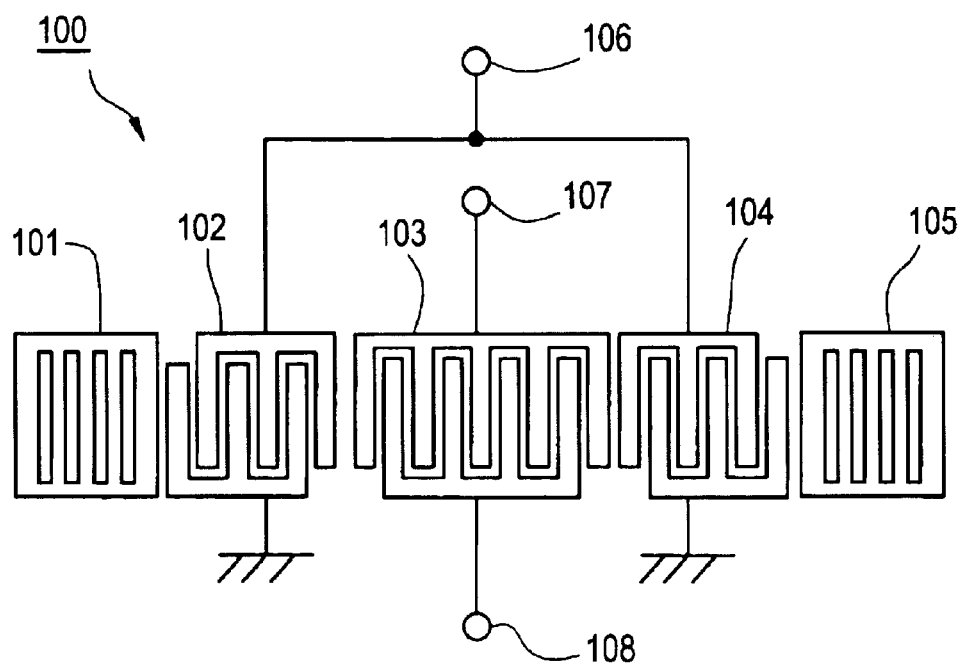
FIG. 18 schematically shows a plan view of a surface acoustic wave filter device having a balance-unbalance conversion function defining related art for comparison to the present invention.

FIG. 17 schematically shows a block diagram for illustrating a communication apparatus 160 which includes at least one of the surface acoustic wave filter devices according to preferred embodiments of the preset invention described above.

In FIG. 17, a duplexer 162 is connected to an antenna 161. Between the duplexer 162 and reception-side mixers 163 and 163a, a switch SW, a surface acoustic wave filter 164 of an RF stage, and amplifiers 165 and 165a are connected. In addition, surface acoustic wave filters 169 and 169a of an IF stage are connected to the mixers 163 and 163a. Between the duplexer 162 and a transmission-side mixer 166, an amplifier 167 and a surface acoustic wave filter 168 of an RF stage are connected.

As the surface acoustic wave filter 164 incorporated in the communication apparatus 160, a surface acoustic wave filter device according to any of the preferred embodiments of the present invention described above can be suitably used.

As described above, in the surface acoustic wave filter device according to preferred embodiments of the present invention, in each of the first and second surface acoustic wave filters, one of the input and output impedances is preferably about four times the other impedance. In addition, the second surface acoustic wave filter is 180 degrees out-of-phase with the first surface acoustic wave filter. Also, $2^{n-1}$ first and second surface acoustic wave filters are connected between the unbalanced signal terminal and the first balanced signal terminal and between the unbalanced signal terminal and the second balanced signal terminal. Accordingly, the difference between the parasitic capacitances added to the first and second balanced signal terminals is greatly reduced and thereby the amplitude balance and the phase balance is significantly improved. As a result, in the surface acoustic wave filter device having the balance-unbalance conversion function and equal input and output impedances, attenuation out of the pass band can be significantly increased.

While preferred embodiments of the present invention have been described above, it is to be understood that modifications and changes will be apparent to those skilled in the art within the scope and spirit of the present invention. The scope of the present invention, therefore, is to be determined solely by the following claims.

What is claimed is:

1. A surface acoustic wave filter device having substantially equal input and output impedances, the filter device comprising:
    an unbalanced signal terminal;
    first and second balanced signal terminals;
    $2^{n-1}$ first surface acoustic wave filters connected between the unbalanced signal terminal and the first balanced signal terminal, where n is an integer equal to or greater than 1; and
    $2^{n-1}$ second surface acoustic wave filters connected between the unbalanced signal terminal and the second balanced signal terminal;
    wherein one of the input and output impedances of each of the first and second filters is approximately four times the other impedance; and
    the second surface acoustic wave filters are 180 degrees out-of-phase with respect to the first surface acoustic wave filters.

2. The surface acoustic wave filter device according to claim 1, wherein each of the first and second surface acoustic wave filters has a plurality of interdigital transducers arranged in a direction in which a surface acoustic wave propagates and at least one of the interdigital transducers is halved in an electrode-finger interdigitating widthwise direction to define first and second interdigital transducer sections, which are connected in series with each other.

3. The surface acoustic wave filter device according to claim 2, wherein one of the first interdigital transducer section and the second interdigital transducer section is connected to a ground potential.

4. The surface acoustic wave filter device according to claim 1, wherein each of the first and second surface acoustic wave filters is a longitudinally-coupled resonator-type surface acoustic wave filter.

5. The surface acoustic wave filter device according to claim 4, wherein the longitudinally-coupled resonator-type surface acoustic wave filter has three interdigital transducers arranged in a surface acoustic wave propagating direction and a central interdigital transducer or interdigital transducers at both sides are halved in the electrode-finger interdigitating widthwise direction to define first and second interdigital transducer sections.

6. The surface acoustic wave filter device according to claim 1, wherein each of the first and second surface acoustic wave filters has a plurality of interdigital transducers and at least one of the plurality of interdigital transducers is halved in a surface acoustic wave propagating direction to define first and second interdigital transducer sections.

7. The surface acoustic wave filter device according to claim 6, wherein each of the first and second surface acoustic wave filters has at least one interdigital transducer that is halved in a surface acoustic wave propagating direction.

8. The surface acoustic wave filter device according to claim 7, wherein each of the first and second surface acoustic wave filters is a longitudinally-coupled resonator-type surface acoustic wave filter.

9. The surface acoustic wave filter device according to claim 8, wherein the longitudinally-coupled resonator-type surface acoustic wave filter has three interdigital transducers and an interdigital transducer positioned at the center is halved in the surface acoustic wave propagating direction.

10. The surface acoustic wave filter device according to claim 1, wherein each of the first and second surface acoustic wave filters has first and second interdigital transducer sections.

11. The surface acoustic wave filter device according to claim 1, wherein each of the first and second surface acoustic wave filters includes interdigital transducers and has a structure in which a surface acoustic wave filter having a plurality of interdigital transducers is constructed such that at least two of the interdigital transducers are connected in series.

12. The surface acoustic wave filter device according to claim 11, wherein each of the first and second surface acoustic wave filters has at least two of the interdigital transducers connected in series.

13. The surface acoustic wave filter device according to claim 12, wherein each of the first and second surface acoustic wave filters is a longitudinally-coupled resonator-type surface acoustic wave filter.

14. The surface acoustic wave filter device according to claim 13, wherein the longitudinally-coupled resonator-type surface acoustic wave filter has three interdigital transducers and the interdigital transducers arranged at both sides in a surface acoustic wave propagating direction are connected in series.

15. A communication apparatus comprising at least one surface acoustic wave filter device according to claim 1.

16. A communication apparatus according to claim 15, wherein the at least one surface acoustic wave filter is a band pass filter.

* * * * *